United States Patent [19]

Toyoda

[11] Patent Number: 4,485,456
[45] Date of Patent: Nov. 27, 1984

[54] DATA PROCESSOR WITH R/W MEMORY WRITE INHIBIT SIGNAL

[75] Inventor: Shinjiro Toyoda, Yokohama, Japan

[73] Assignee: Tokyo Shibaura Denki Kabushiki Kaisha, Kawasaki, Japan

[21] Appl. No.: 369,359

[22] Filed: Apr. 19, 1982

[30] Foreign Application Priority Data

Apr. 21, 1981 [JP] Japan .................. 56-60128

[51] Int. Cl.³ .......................................... G06F 13/00
[52] U.S. Cl. .................................................. 364/900
[58] Field of Search ... 364/900 MS File, 200 MS File

[56] References Cited

U.S. PATENT DOCUMENTS

| | | | |
|---|---|---|---|
| 3,911,406 | 10/1975 | McLaughlin et al. | 364/200 |
| 4,328,558 | 5/1982 | Musa et al. | 364/900 |
| 4,387,442 | 6/1983 | Stuehler | 364/900 |

OTHER PUBLICATIONS

Motorola Semiconductors, Advance Information ADI-803R2, p. 20.
National Semiconductor 48-Series, Microcomputers Handbook 1980, pp. 2-19 and 2-20.

Primary Examiner—Raulfe B. Zache
Attorney, Agent, or Firm—Finnegan, Henderson, Farabow, Garrett & Dunner

[57] ABSTRACT

A main power source voltage is compared with a reference voltage, when the main power voltage drops lower than the reference voltage, an operation/halt signal is formed, a read/write memory write inhibit signal is formed in response to the operation/halt signal, and the read/write memory is inhibited in operation. This write inhibit signal is formed by setting a D-type latch at the timing of the transition of the NIF signal to active mode.

4 Claims, 14 Drawing Figures

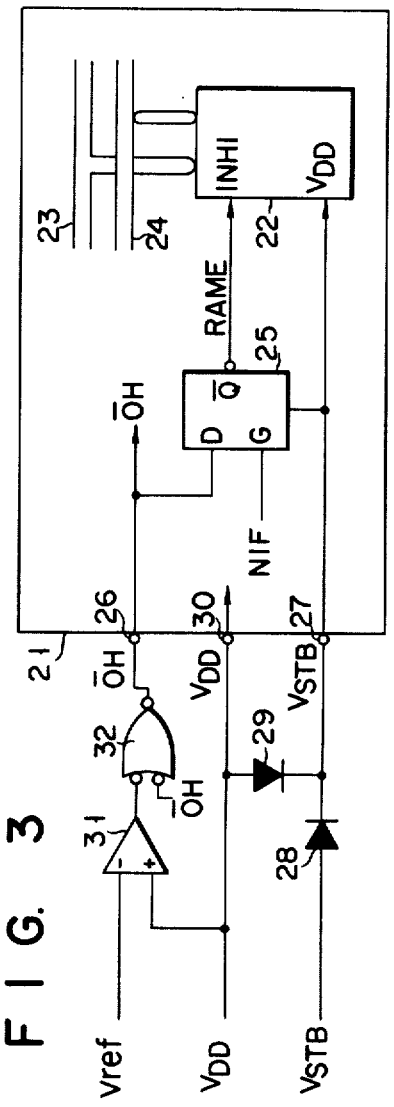
F I G. 3
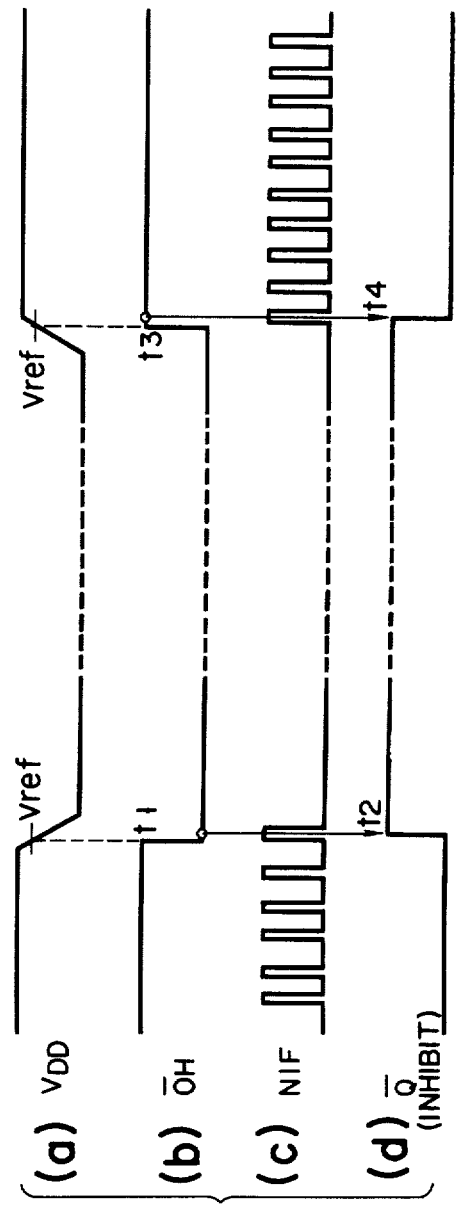
F I G. 4

F I G. 5
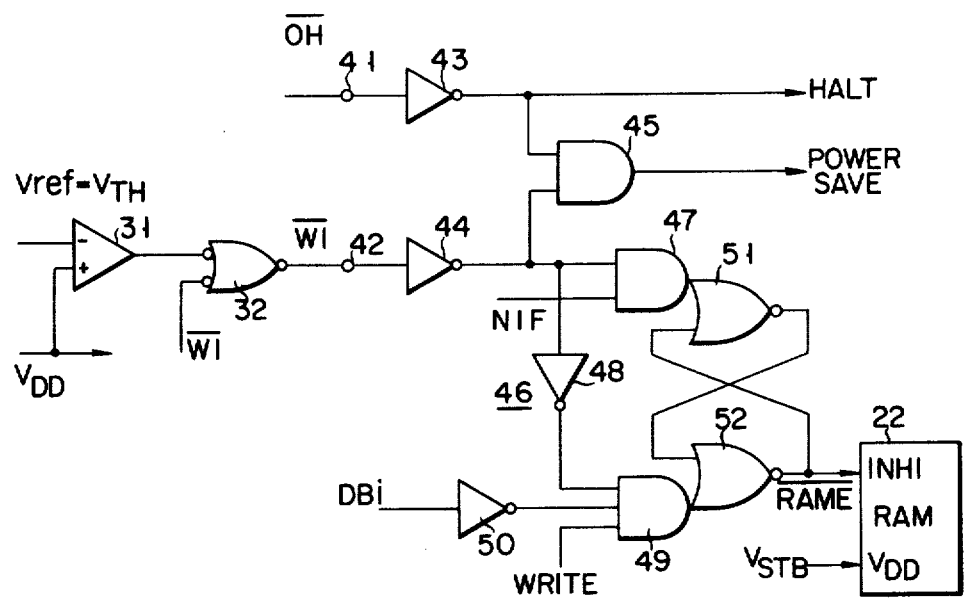
F I G. 6
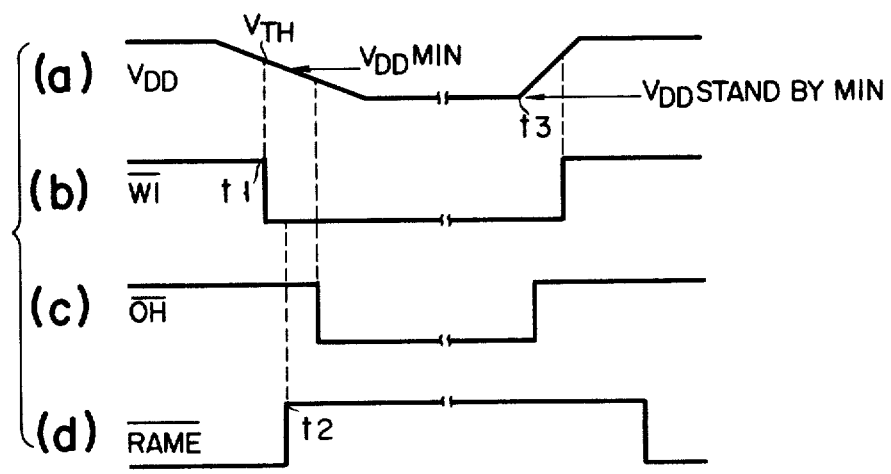

4,485,456

DATA PROCESSOR WITH R/W MEMORY WRITE INHIBIT SIGNAL

BACKGROUND OF THE INVENTION

The present invention relates to a data processor adapted for a 1-chip microcomputer.

In a 1-chip microcomputer, a central processing unit or a micro-processing unit is built in together with a read/write memory. The stored contents of the read/write memory is correctly maintained when a power source voltage is a normal value, but if the power source voltage is lowered less than a rated value or the power source is interrupted, an error occurs in the contents or the contents are erased. Therefore, an auxiliary power source for retaining the contents of the memory is additionally provided. FIG. 1 shows one example of a conventional 1-chip microcomputer. In the conventional microcomputer 1, a read/write memory 2 is built in, and is connected through an address bus 3 and a data bus 4 to a micro-processing unit (not shown) provided in a chip. In the memory 2 are provided a read/write inhibit terminal and a power terminal. A D-type latch 5 is connected at the Q output as an inhibit flag to the inhibit terminal. The data bus 4 is coupled to the D input of the latch 5, and a write signal is coupled to the G input of the latch 5. A non-maskable interrupt ($\overline{NMI}$) input from a comparator 7 is applied to the interrupt input pin 6 of the chip 1. A reference voltage Vref is applied to the reference input terminal of the comparator 7, and a power voltage $V_{DD}$ is applied to the comparison input terminal of the comparator 7. The power voltage $V_{DD}$ is supplied to the power input pin 8 of the chip 1, and a stand-by voltage $V_{STB}$ is applied through a diode 10 to an auxiliary power input pin 9. The power voltage $V_{DD}$ is also applied through a diode 11 to the input pin 9. The latch 5 is energized by the auxiliary power voltage $V_{STB}$.

The operation of the circuit shown in FIG. 1 will be described with reference to FIG. 2. When the power voltage $V_{DD}$ is higher than the reference voltage Vref, the output of the comparator 7 is high, and the non-maskable interrupt signal $\overline{NMI}$ is, as shown in FIG. 2(b), high. When $V_{DD} <$ Vref occurs at the time t1, the output of the comparator 7 becomes low, and the interrupt signal $\overline{NMI}$ is applied to the interrupt input pin 6. Since the power voltage $V_{DD}$ is substantially equal to the Vref immediately after the signal $\overline{NMI}$ is produced and the chip 1 operates normally, data to be stored in the memory 2 is stored therein. Thereafter, a write inhibit signal is applied, as shown in FIG. 2(c), from the Q output terminal of the latch 5 to the inhibit terminal. The setting operation of the latch 5 is carried out by a software. Since the memory 2 and the latch 5 are energized, even if the power voltage $V_{DD}$ is lowered, by the stand-by voltage $V_{STB}$, the data of the memory 2 and the inhibit output of the latch 5 are normally maintained continuously.

When the power voltage $V_{DD}$ is recovered and becomes higher than the reference voltage Vref at the time t2, the output of the comparator 7 again becomes high. The chip 1 thus executes a program (software processing) to allow the Q output of the latch 5 to become, as shown in FIG. 2(c), low, and the memory 2 is thus reset to the accessible state. Since the aforementioned conventional memory protecting system, however, performs the protection processing by the program (software) when the power voltage is extraordinarily lowered, following various drawbacks and disadvantages occur.

(a) A non-maskable interrupt must be exclusively prepared so as to inform the abnormal drop of the power voltage $V_{DD}$ to the micro-processing unit, and an exclusive input pin 6 must be necessarily provided therefor at the chip 1.

(b) Since the data is saved in the memory 2 after $V_{DD} <$ Vref occurs and the inhibit setting by the latch 5 is carried out, it is necessary to maintain the operation of the micro-processing unit normal only during this period, and a variety of remedies should be necessarily provided so as not to abruptly lower the power voltage $V_{DD}$.

(c) Inasmuch as the latch 5 is set by the program or software, when the power voltage $V_{DD}$ drops lower than the lower normal operation limit value of the micro-processing unit to bring the micro-processing unit into the indefinite state, the latch 5 is reset, and the contents of the memory 2 are feasibly rewritten.

(d) Since the aforementioned non-maskable interrupt processing program is thus necessary, the program area to be used by a user is diminished that much.

(e) It is, of cource, considered to control the latch 5 directly by the $\overline{NMI}$ signal to the input pin 6, but when this control is performed during the data writing operation, an erroneous data tends to be written in the memory.

SUMMARY OF THE INVENTION

It is an object of the present invention to provide a data processor of the configuration adapted for a 1-chip microcomputer while eliminating the aforementioned various drawbacks and disadvantages of the conventional one.

According to the present invention, there is provided a data processor in which an instruction for setting an operation into a holding mode in which the contents of a memory is held is fed when an abnormal power voltage drop is detected, to a micro-processing unit with an operation halt (OH) signal.

BRIEF DESCRIPTION OF THE DRAWINGS

FIG. 3 is a block circuit diagram showing one preferred embodiment of a data processor according to the present invention;

FIG. 4, consisting of (a)-(d), is a timechart for the explanation of the operation of the circuit in FIG. 3;

FIG. 5 is a block circuit diagram of another preferred embodiment of the data processor according to the present invention; and FIG. 6, consisting of (a)-(b), is a timechart for the explanation of the operation of the circuit in FIG. 5.

DETAILED DESCRIPTION OF THE PREFERRED EMBODIMENTS

Figure 1:
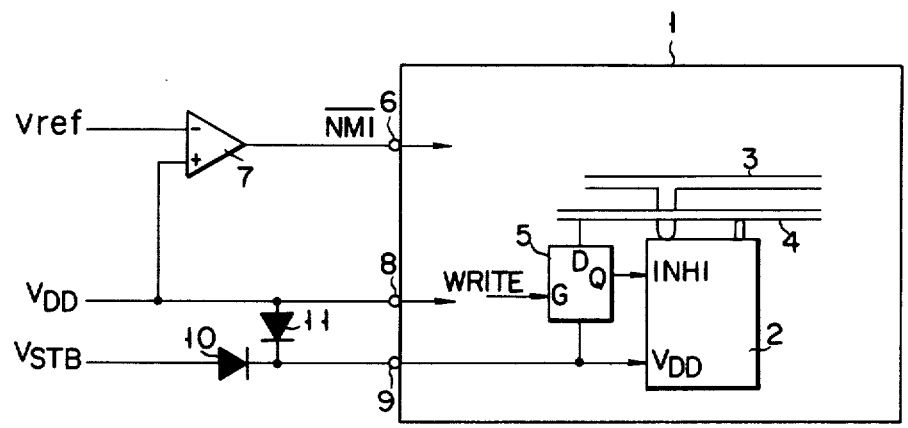
FIG. 1 is a block circuit diagram showing one example of a conventional 1-chip data processor.
Figure 2:
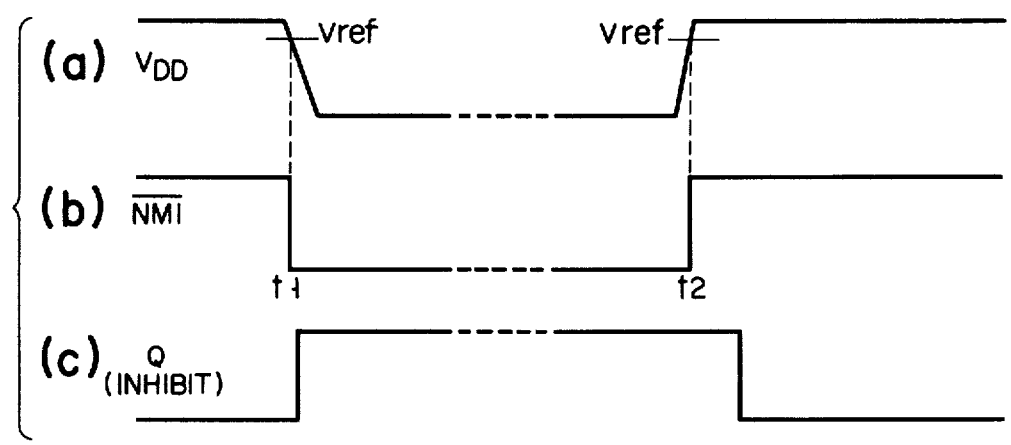
FIG. 2, consisting of (a)-(c), is a timechart for the explanation of the operation of the circuit in FIG. 1.

The present invention will now be described in more detail with reference to the accompanying drawings.

In FIG. 3, a read/write memory, i.e., a RAM 22 and a micro-processing unit (not shown) are provided in a microcomputer chip 21. The RAM 22 is connected through an address bus 23 and a data bus 24 to the micro-processing unit. In the RAM 22 are provided an inhibit terminal and a power source voltage $V_{DD}$ terminal, and a RAM enable signal RAME is applied from the $\overline{Q}$ output terminal of a D-type latch 25 to an inhibit terminal. An operation halt signal OH from the input pin 26 of the chip 21 is applied to the D terminal of the latch 25. A next instruction fetch (NIF) signal is applied to a G input terminal. A stand-by voltage $V_{STB}$ from the input pin 27 of the chip 21 is applied to the power voltage $V_{DD}$ terminal of the memory 22 and the power terminal of the latch 25. The input pin 27 is connected commonly to the cathodes of diodes 28 and 29, and the stand-by voltage $V_{STB}$ is applied to the anode of the diode 28. The anode of the diode 29 is applied with the power voltage $V_{DD}$, which is also applied to the power voltage $V_{DD}$ input pin 30 of the chip 21 and the comparison input terminal of the comparator 31. The reference voltage Vref is applied to the reference input terminal of the comparator 31, and the output terminal of the comparator 31 is connected to one inversion input terminal of an invert-NOR circuit 32. An operation halt signal OH is supplied to the other inversion input terminal of the circuit 32. The output of the invert-NOR circuit 32 is coupled to the input pin 26.

The operation of the embodiment shown in FIG. 3 will be described with reference to FIG. 4. When the power voltage $V_{DD}$ is first at rated value, the output of the comparator 31 is high, and accordingly the output of the invert-NOR circuit 32 and hence the operation-halt signal OH supplied to the input pin 26 is also, as shown in FIG. 4(b), high. Since the latch 25 is not set by the high signal OH, the $\overline{Q}$ output is, as shown in FIG. 4(d), low. Therefore, the write inhibit signal is not supplied to the RAM 22.

When the power voltage $V_{DD}$ becomes lower than the reference voltage Vref at the time t1 as shown in FIG. 4(a), the output of the comparator 31 becomes low, and the output signal OH of the invert-NOR circuit 32 also becomes, as shown in FIG. 4(b), low. When the next instruction fetch (NIF) becomes, as shown in FIG. 4(c), high at the time t2 in the state that the low signal OH is supplied to the D terminal of the latch 25, the latch 25 is set at this timing, and the $\overline{Q}$ output becomes, as shown in FIG. 4(d), high. This NIF signal is approx. 7 μsec. at the longest even when the microcomputer 21 carries out the division operation which takes the longest time, and which means that the period from the time t1 to the time t2 is approx. 7 μsec. at the highest. Since the RAM 22 is inhibited in writing after the time t2, the writing of the RAM 22 is inhibited in extremely short time after $V_{DD} < V_{ref}$ occurs. Thus, the memory protection can be rapidly and effectively performed. When $V_{DD} < V_{ref}$ occurs, $V_{DD} < V_{STB}$ also occurs, and only the RAM 22 and the latch 25 are energized by the auxiliary power source $V_{STB}$ by the operation of the diode 29. Accordingly, even if the $V_{DD}$ power source becomes zero level, the contents of the RAM 22 is readily retained.

When the power voltage $V_{DD}$ is recovered and $V_{DD} > V_{ref}$ takes place, as shown in FIG. 4(a), at the time t3, the output of the comparator 31 again becomes high, and the OH signal also becomes, as shown in FIG. 4(b), high. When the NIF signal becomes, as shown in FIGS. 4(c) and 4(d) at the time t4 in case that the high OH signal is supplied to the D terminal of the latch 25, the latch 25 is reset, the $\overline{Q}$ output becomes low, and an access to the RAM 22 can be again allowed.

In the embodiment shown in FIG. 3, the following three advantages can be provided:

(I) The input pin 26 of the operation/halt signal is normally provided in the 1-chip microcomputer 21, and is utilized, and accordingly it is not necessary to provide the additional input pin in the chip.

(II) It is not necessary to prepare an exclusive interrupt processing program in the micro-processing unit when the power voltage extraordinarily drops, and accordingly the memory area can be excessively used that much as compared with the conventional one.

(III) Since all the operation from the state of $V_{DD} < V_{ref}$ to the write inhibition of the RAM 22 can be carried out by a hardware in a short time, the micro-processing unit is halted and the micro-processing unit can not access to the bit of the RAME, the contents of the RAM 22 are not rewritten to meaningless data, but an effective operation can be expected.

(IV) The time from the occurrence of $V_{DD} < V_{ref}$ to the arrival of the lower limit $V_{DDmin}$ of the $V_{DD}$ as required becomes short, and thus the allowance for the power source becomes large.

Another preferred embodiment according to the present invention will be described with reference to FIG. 5. In FIG. 5, an operation/halt $\overline{OH}$ signal is supplied to an external input terminal 41, and the write inhibition signal $\overline{WI}$ is supplied to an input terminal 42. The signals $\overline{OH}$, $\overline{WI}$ are inverted via inverters 43 and 44, respectively, and the signal OH is used as a halt signal. The outputs from the inverters 43, 44 are coupled to the input terminals of an AND circuit 45, and the output of the AND circuit 45 is used as a power save signal.

The output WI of the other inverter 44 is coupled to one input terminal of an AND circuit 47 of a protecting circuit 46 and to the input terminal of an inverter 48. The output of the inverter 48 is coupled to the first input terminal of an AND circuit 49, an arbitrary 1 bit DBi of the data bus in the CPU is supplied through an inverter 50 to the second input terminal of the AND circuit, and a write signal WRITE for the address of the RAM protect flag arbitrarily assigned is supplied to the third input of the AND circuit. The outputs of the AND circuits 47 and 49 are respectively coupled to one input terminals of the NOR circuits 51 and 52. The output of the NOR circuit 51 is coupled to the other input of the NOR circuit 52, and the output of the NOR circuit 52 is coupled to the other input of the NOR circuit 51. The output of the NOR circuit 52 is used as a $\overline{RAME}$ signal as the write inhibit signal of the stand-by RAM.

Four statuses are defined as below Table 1 by the logic levels of the inputs $\overline{OH}$, $\overline{WI}$ to the two terminals 41 and 42.

TABLE 1

| $\overline{WI}/\overline{OH}$ | 0 | 1 |
|---|---|---|
| 0 | POWER SAVE | RAM WRITE PROTECT |
| 1 | CPU HALT | NORMAL OPERATION |

The operation of the circuit shown in FIG. 5 will be described with reference to FIG. 6. The $V_{DD}$ and the Vref are compared by a comparator 31 in the same manner as the first embodiment shown in FIG. 3. Here, $Vref = V_{TH}$, where the $V_{TH}$ is set to an adequate threshold voltage. Accordingly when the $V_{DD}$ is lowered to the $V_{TH}$ at the time t1, as shown in FIG. 6(a), the signal $\overline{WI}$ supplied to the terminal 42 becomes, as shown in FIG. 6(b), low at the time t1.

When the NIF signal to the AND circuit 47 becomes active (high) at the time t2, the output $\overline{RAME}$ of the circuit 46 becomes high at this timing. Therefore, the writing to the RAM 22 is inhibited. Since the $\overline{OH}$ signal is yet high as shown in FIG. 6(c) at this time, the circuit 46 in FIG. 5 operates in the stand-by RAM WRITE PROTECT mode as seen from the TABLE 1. Thereafter, the signal $\overline{OH}$ becomes, as shown in FIG. 6(c), low, and then the CPU is operated in POWER SAVE mode as seen from the TABLE 1. When the $V_{DD}$ is gradually recovered from the time t3 in FIG. 6(a), the signals $\overline{OH}$, $\overline{WI}$ sequentially become high, and after the signal $\overline{WI}$ becomes high, the flag is cleared by the software. Then, the RAM 22 will perform an ordinary operation as seen from the TABLE 1. In this manner, the WRITE inhibition of the RAM 22 can be preferably performed by the hardware even if the D-type latch is not used.

As described above, exclusive inhibition input terminal pin and program are not employed according to the present invention, and thus the data processor of the present invention can accordingly be adapted for a 1-chip microcomputer, in which the memory is effectively protected, and the allowance for the requirements against the power source is large advantageously in the data processor of the present invention.

What is claimed is:

1. A data processor comprising:
    an operation/halt signal input terminal;
    means responsive to the operation/halt signal supplied to said input terminal for forming a write inhibit signal;
    a read/write memory inhibited by the write inhibit signal from said signal forming means;
    an auxiliary power source means for energizing said signal forming means and said read/write memory; and
    means for comparing a main power source voltage with a reference value and forming the operation/halt signal.

2. The data processor according to claim 1, wherein said inhibit signal forming means comprises a D-type latch.

3. The data processor according to claim 1, wherein said operation/halt signal forming means comprises:
    a comparator for comparing the main power voltage with a reference voltage;
    an invert-NOR circuit supplied with the output from said comparator to one input terminal thereof; and
    means for supplying the output of said invert-NOR circuit as an operation/halt signal to the operation/halt signal input terminal.

4. The data processor according to claim 1, wherein said write inhibit signal forming means and said read/write memory are associated integrally within a 1-chip microcomputer.

* * * * *